United States Patent

Christensen

[15] 3,652,906

[45] Mar. 28, 1972

[54] MOSFET DECODER TOPOLOGY

[72] Inventor: Alton O. Christensen, 8906 Valley View Lane, Houston, Tex. 77036

[22] Filed: Mar. 24, 1970

[21] Appl. No.: 22,195

[52] U.S. Cl. ....................317/235, 317/235 B, 317/235 G, 307/304, 307/303, 317/235 D

[51] Int. Cl. ....................H01l 11/14, H01l 19/00

[58] Field of Search ....................317/235 D, 235 B, 235 G; 307/304, 303

[56] References Cited

UNITED STATES PATENTS 3,414,740 12/1968 Dailey ....................307/304

3,383,569 5/1968 Lüscher ....................317/235

3,427,514 2/1969 Olmstead ....................317/235

*Primary Examiner*—John W. Huckert

*Assistant Examiner*—Martin H. Edlow

*Attorney*—J. H. McCarthy and T. E. Bieber

[57] ABSTRACT

The internal capacitance of parallel-gate IGFET structures such as FARMOST NOR gates is substantially reduced by giving the gated area of the substrate a U-shaped configuration so that each gate electrode extends from one leg of the source or drain diffusion to the other leg of the same diffusion across the other diffusion and two gated substrate areas, forming in effect a pair of parallel-connected IGFETS. The reduced capacitance permits the use of much smaller devices requiring much less drive current for the same output current.

5 Claims, 5 Drawing Figures

INVENTOR.
ALTON O. CHRISTENSEN
BY
Mellin, Moore & Weissenberger
ATTORNEYS

MOSFET DECODER TOPOLOGY

BACKGROUND OF THE INVENTION

FARMOST (Fast Action Ratioless Metal Oxide Silicon Transistor) decoders are basic elements of the addressing circuitry of MOSFET (Metal Oxide Silicon Field Effect Transistor) memories. These decoders are essentially MOSFET NOR gates whose operation involve the cyclic charge and discharge of the capacitance of the driven load.

In order to realize the full benefits of FARMOST circuitry, it is necessary to minimize the inherent capacitance of the decoder so as to reduce the speed and power loss resulting from the rapid charge and discharge of the circuit's inherent capacitance. By the same token, the reduction of the inherent capacitance, and the reduced heat dissipation resulting from the decrease in power loss, allow the use of smaller decoders for an attendant saving in space.

SUMMARY OF THE INVENTION

The topology of this invention reduces the size and inherent capacitance of a FARMOST NOR gate by more than 50 percent, as compared to the prior art topology, without any reduction in the rated load capacitance or clock frequency, and with a considerable reductive in drive power requirements.

Essentially, the inventive topology involves the use of a U-shaped gate area encompassed between a U-shaped drain diffusion and an elongated source diffusion running down the center of the U. In effect, each gate is composed of two half-gates with a common source electrode and physically separate through electrically interconnected drain electrodes.

In the case of a FARMOST NOR gate, the U-shaped drain diffusion may advantageously be formed integrally with a diffusion serving as the clock bus.

It should be understood, however, that the inventive concept is not necessarily restricted to NOR gates but is also applicable to other multi-gate configurations of MOSFET circuitry.

It is therefore the object of the invention to provide a topology for multi-gate MOSFET circuits which minimizes the inherent capacitance of the circuit.

DESCRIPTION OF THE PREFERRED EMBODIMENT

Figure 1:
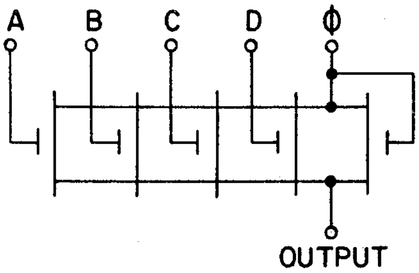
FIG. 1 is a circuit diagram of a FARMOST NOR gate.
Figure 2:
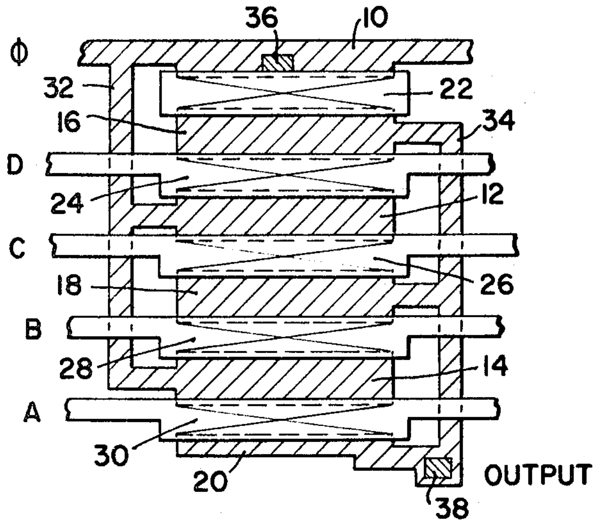
FIG 2 (PRIOR ART)
FIG. 2 is the prior art topology of the gate of FIG. 1.

FIG. 2 of the drawings shows the conventional interleaved topology of the FARMOST NOR gate of FIG. 1. In that configuration, parallel elongated drain diffusions 10, 12, 14 were alternated with parallel elongated source diffusions 16, 18, 20. Gate electrodes 22, 24, 26, 28 and 30 were overlaid over the five spaces separating the six diffusions to form the precharge gate and the four input gates A, B, C, D of the circuit of FIG. 1. The drain diffusions 10, 12, 14 on one side, and the source diffusions 16, 18, 20 on the other side, were joined by interconnecting diffusions 32, 34 respectively.

With the drain diffusion 10 being also a part of the clock bus $\phi$, the precharge gate 22 was connected to the clock bus $\phi$ at the junction 36. The junction 38 was the output of the circuit.

Figure 3:
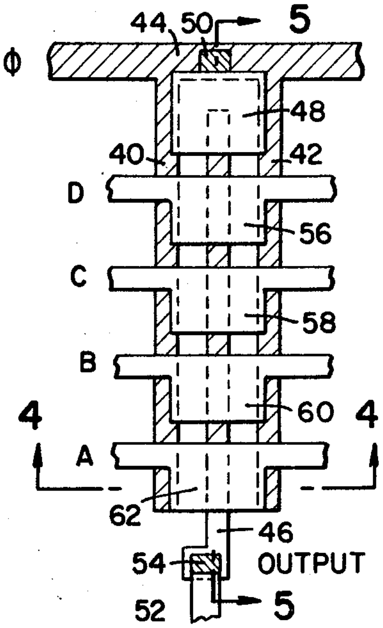
FIG. 3 is a plan view showing the topology of the gate of FIG. 1 when constructed in accordance with the present invention.
Figure 4:
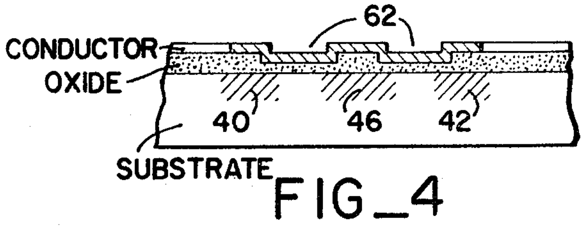
FIG. 4 is a vertical section along line 4—4 of FIG. 3.
Figure 5:
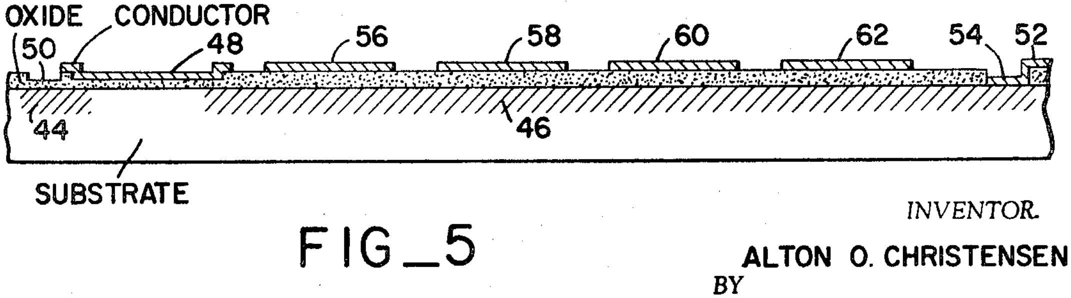
FIG. 5 is a vertical section along line 5—5 of FIG. 3.

By contrast, the topology of this invention, as shown in FIGS. 3 through 5, provides a single U-shaped drain diffusion having spaced parallel legs 40, 42 and a central connecting portion 44. An elongated source diffusion 46 is disposed parallel to the legs 40, 42 and between them, ending short, however, of the connecting portion 44. It will be noted that in other situations the central region 46 could be the drain and the U-shaped region 40, 42, could be the source.

The connecting portion 44 may also advantageously be a part of the clock bus $\phi$, and the precharge gate 48 may be connected to it by junction 50. The output bus 52 is connected to the source diffusion 46 by junction 54.

The input gate electrodes 56, 58, 60 and 62 extend between the legs 40, 42 and are placed astraddle the source diffusion 46. Thus each of the gate electrodes 56, 58, 60 and 62 defines a pair of parallel-connected gates, one between leg 40 and source diffusion 46, the other between leg 42 and source diffusion 46. The precharge gate 48 defines a single, U-shaped gate bordered by legs 40, 42 and connecting portion 44 on the one hand, and the tip of source diffusion 46 on the other hand.

It has been found empirically that the structure of FIG. 3 is capable of handling the same output load capacitance at the same clock rate as the structure of FIG. 2. However, the area required for the prior art structure (i.e., the distance from the left edge of connecting diffusion 32 to the right edge of connecting diffusion 34, times the distance from the top edge of clock bus 10 to the bottom edge of connecting diffusion 34) is 28.8 square mils in a typical embodiment, whereas the corresponding area for a FIG. 3 structure of the same rating is only 12.24 square mils.

Likewise, the inherent driven capacitance (i. e. the source diffusion-to-substrate capacitance) of a FIG. 2 circuit of the aforesaid dimensions is 1.09 pf., whereas the inherent driven capacitance of the corresponding FIG. 3 circuit is only 0.3 pf. The gate capacitance of each gate of the prior art embodiment of FIG. 2 is about 0.53 pf., whereas in the embodiment of FIG. 3, the input 56, 58, 60 and 62 gates each have a capacitance of about 0.25 pf. The somewhat larger precharge gate 48 has a capacitance of about 0.31 pf.

It will be seen that the topology of FIG. 3 is considerably easier to drive, because of the reduced gate capacitance, and considerably more efficient, because of the reduction in the inherent driven capacitance. Consequently, for the same load, the embodiment of FIG. 3 is much smaller, requires much less drive power and has much less heat dissipation than the prior art embodiment of FIG. 2.

Although the invention has been described herein in the context of a four-input NOR gate, it will be understood that the principles of the invention are equally applicable to other circuits of similar nature and with more or fewer inputs than in the embodiment shown.

I claim:

1. A low-capacitance IGFET structure, comprising:
   a. substrate means including a semiconductor material having a first polarity;
   b. source and drain diffused regions having the opposite polarity formed in said substrate means;
   c. a plurality of separate metallic gate electrode means overlaid over portions of said substrate means and diffusions, but electrically separated therefrom by an insulating layer;
   d. one of said source and drain diffused regions including a pair of interconnected but spaced diffused regions; the other of said source and drain diffused regions including a single diffused region positioned between said spaced diffused regions; and each of said separate gate electrode means being positioned to extend across said single diffused region from one of said spaced diffused regions to the other.

2. A low-capacitance IGFET parallel-gate structure, comprising:
   a. substrate means including a semiconductor material having a first polarity;
   b. source and drain diffused regions having the opposite polarity formed in said substrate means;
   c. a plurality of separate spaced metallic gate electrodes overlying portions of said substrate means and diffused regions but electrically separated therefrom by an insulating layer;
   d. one of said diffused regions being in the form of a first elongated strip; the other diffused region being in the form of a pair of second interconnected elongated strips positioned one on each side of said first strip and generally parallel thereto; and each of said separate gate electrodes extending generally transversely across said first strip from one of said second strips to the other.

3. A low-capacitance IGFET NOR-gate structure, comprising:

a. substrate means including a semiconductor material having a first polarity;

b. source and drain diffused regions having the opposite polarity formed in said substrate means;

c. a plurality of separate spaced metallic gate electrodes overlying portions of said substrate means and diffused regions but electrically separated therefrom by an insulating layer;

d. one of said diffused regions being in the form of a first elongated strip; the other diffused region being in the form of a pair of a second interconnected elongated strips positioned one on each side of said first strip and generally parallel thereto; and each of said separate gate electrodes extending generally transversely across said first strip from one of said second strips to the other;

e. one of said gate electrodes being electrically connected to said second strips; and f. metallic output connection means electrically connected to said first strip.

4. The NOR-gate structure of claim 3, in which the interconnection between said second strips is connected in the circuit of the NOR-gate as the clock bus.

5. The NOR-gate structure of claim 4, in which the interconnection between said second strips is a diffused region extending transversely between said second strips, said interconnection being spaced from one end of said first strip so that the substrate area separating said source and drain diffused regions is generally U-shaped.

* * * * *